(12) United States Patent
Kim

(10) Patent No.: US 6,411,669 B1
(45) Date of Patent: Jun. 25, 2002

(54) DUAL-MODULUS PRESCALER FOR RF SYNTHESIZER

(75) Inventor: Se Yeob Kim, Seoul (KR)

(73) Assignee: C&S Technology Co., Ltd., Seoul (KR)

( * ) Notice: Subject to any disclaimer, the term of this patent is extended or adjusted under 35 U.S.C. 154(b) by 0 days.

(21) Appl. No.: 09/648,746

(22) Filed: Aug. 28, 2000

(30) Foreign Application Priority Data

May 25, 2000 (KR) ............................................. 00-28377

(51) Int. Cl.[7] ................................................. H03K 21/00
(52) U.S. Cl. ........................................... 377/48; 377/47
(58) Field of Search ..................................... 377/47, 48

(56) References Cited

U.S. PATENT DOCUMENTS 6,031,425 A * 2/2000 Hasegawa ..................... 377/47
6,163,181 A * 12/2000 Nishiyama ..................... 377/47

* cited by examiner

Primary Examiner—Margaret R. Wambach
(74) Attorney, Agent, or Firm—Bacon & Thomas

(57) ABSTRACT

A dual-modulus prescaler for a RF frequency synthesizer, which may operate in a high speed and reduce energy consumption with use of a selective latching technique includes a first frequency-dividing circuit for being synchronized to the clock signal to generate a latch control signal, latching the clock signal at a leading edge of the generated latch control signal, changing the frequency-dividing mode from a first frequency-dividing mode to a second frequency-dividing mode when latching the clock signal, and frequency-dividing and outputting the clock signal; a second frequency-dividing circuit for frequency-dividing the frequency divided signal from the first frequency-dividing circuit at a predetermined frequency-dividing ratio and outputting a plurality of frequency divided signals; and a logic operation circuit for logically operating a plurality of the frequency divided signals and the mode control signal to control the frequency-dividing mode of the first frequency-dividing circuit.

9 Claims, 16 Drawing Sheets

DUAL-MODULUS PRESCALER FOR RF SYNTHESIZER

BACKGROUND OF THE INVENTION

1. Technical Field

The present invention relates to a dual-modulus prescaler for a RF frequency synthesizer, and more particularly to a dual-modulus prescaler for a RF frequency synthesizer, which may operate in a high speed and reduce energy consumption.

2. Description of the Prior Art

Generally, a radio frequency (RF) synthesizer means a phase locked loop (hereinafter, referred as PLL), which outputs wider-ranged frequency by adjusting values of a programmable counter and is applied mainly to communication systems such as a portable personal mobile communication, an amateur communication, airplane, and so on.

FIG. 1 is a block diagram showing a receiver in the general portable personal mobile communication. As shown in the figure, the receiver includes a low-noise amplifier 10 for linearly amplifying at a predetermined ratio a signal received from a public network through an antenna 1, a variable frequency synthesizer 20 for generating an oscillation signal with a variable frequency, a first mixer 40 for generating a signal with a middle frequency by mixing a frequency of the signal amplified in the low-noise amplifier 10 and a frequency of the output signal of the variable frequency synthesizer 20, a middle frequency amplifier 60 for amplifying the signal with the middle frequency at a predetermined ratio and outputting the amplified signal, a fixed frequency synthesizer 80 for first and second oscillation signals with fixed frequencies, a second mixer 100 for outputting first and second mixed signals by mixing a frequency of the signal amplified in the middle frequency amplifier 60 and a frequency of the signal from the fixed frequency synthesizer 80, a low-pass filter 120 for filtering to pass a low frequency bandwidth of the first and second mixed signals, and an analog-digital (AD) converter 140 for converting an analog signal filtered in the low-pass filter 120 to a digital signal and outputting a baseband signal (BBS).

FIG. 2 is a block diagram for illustrating the general frequency synthesizer 20. As shown in the figure, the frequency synthesizer 20 includes a phase detector 21 for detecting phases of a reference frequency $F_r$ and a feedback input frequency to generate an error signal voltage, a charge pump 22 for pumping a charge according to the error signal voltage, a loop filter 24 for integrating outputs of the charge pump 22 and controlling a PLL loop gain, a voltage controlled oscillator (VCO) 26 for outputting, as a clock signal CLK, a signal in an oscillation frequency $F_o$ controlled in response to an error signal voltage, which eliminates noise from the loop filter 24, and a programmable frequency divider 28 outputting a frequency signal divided at a predetermined ratio in response to the clock signal CLK from the VCO 26 and feeding back the divided frequency signal as an input of the phase detector 21.

The programmable frequency divider 28 includes a dual-modulus prescaler 28a for dividing the clock signal CLK from the VCO in first and second modes with different dividing ratios in response to a feedback counting signal (MC) and outputting the divided clock signal CLK, a first counter 28b for counting clock pulses divided in the dual-modulus prescaler 28a to output the count as an input frequency signal of the phase detector 21, and a second counter 28c for counting clock pulses divided in the dual-modulus prescaler 28a and outputting a mode control signal (MC) according to the count to the dual-modulus prescaler 28a.

The frequency synthesizer 20 has a configuration that the loop filter 24 and the VCO are attached to outside of a PLL module having the phase detector 21, the charge pump 22 and the programmable frequency divider 28.

In the frequency synthesizer constructed as above, the output frequency $F_o$ becomes a value multiplying the reference frequency $F_r$ by a total dividing ratio (M) which is divided by the programmable frequency divider 28.

Such RF variable frequency synthesizer using a Pulse Swallow Method includes the programmable frequency divider 28 in which a total dividing ratio is M and which is composed of three elements: the dual-modulus prescaler 28a and the first and second counters 28b, 28c. At this time, the output frequency $F_o$ of each element is determined by combinations of programmed counts of the elements.

Provided that a dividing ratio of the dual-modulus prescaler 28a is P and counts of the first and second counters 28b, 28c are respectively N and S, the output frequency $F_o$ is calculated as follows.

$$F_o = M\_F_r \qquad \text{Equation 1}$$
$$= (P\_N + S)F_r$$

where,
$P = 2^n$, $(n=1, 2, - - -)$
$S = 0 \sim (P-1)$
$N \geq S$.

The dual-modulus prescaler 28a at first divides the CLK frequency of the VCO 26 in the first and second modes having different dividing rates, for example P and P+1. In fact that the VCO 26 operates in the highest frequency in the frequency synthesizer, the dual-modulus prescaler 28a also requires high speed operation.

Such high speed operation consumes much energy and the prescaler 28a occupies most of the power consumed in the PPL module.

Therefore, the high speed operation and low energy consumption of the prescaler 28a is needed to the RF synthesizer for the mobile communications.

The prescaler 28a currently used is implemented in a shift register ring method.

FIG. 3 is a block diagram showing the conventional prescaler 28a employing the shift register ring method. As shown in the figure, the prescaler 28a includes a high speed synchronous divider 28a-1 operating at a 4/5 dividing rate, a low speed asynchronous divider 28a-2 operating at a 32 dividing rate, and a logic gate 28a-3.

The synchronous divider 28a-1 includes first to third flip-flops FF1–FF3 which is synchronous with the CLK of the VCO 26, an inverter INV for inverting an output of the first flip-flop, a first NAND gate (ND1) for inverted-AND operating an output signal of the inverter INV and an inputted control signal CTR and outputting the operated signal as an input of the second flip-flop FF2, and a second NAND gate (ND2) for inverted-AND operating the output signals of the first and second flip-flops FF1, FF2 and outputs the operated signals as inputs of the third flip-flop FF3.

The output signal of the third flip-flop FF3 is fed back as an input of the first flip-flop FF1 as well as used as a synchronous signal of the asynchronous divider 28a-2.

The asynchronous divider 28a -2 includes five two-dividing flip-flops (FF4–FF8) for supplying an output Q as a synchronous signal of the next flip-flop and feeding back an inverse output /Q as an input thereof. The fourth flip-flop FF4 is synchronous with an output signal of the third flip-flop FF3.

The logic gate 28a-3 includes an AND gate for AND operating output signals of the two-dividing flip-flops FF4–FF8 and a mode control signal MC from the second counter 28c.

Operation of the dual-modulus prescaler 28a employing the shift register ring method and constructed is explained below with reference to a timing diagram in FIG. 4.

The dual-modulus prescaler 28a selects a dividing rate according to a logic level of the mode control signal MC, which can be P or P+1. In other words, the dividing ratio is P when the mode control signal MC is a logic level "low", or else the dividing ratio is P+1.

At first, a dividing operation at $P(=2^7=128)$ is same as a ripple counter. That is, because the AND gate of the decoder 28a-3 always outputs low when the mode control signal MC is selected as a logic level "low", the control signal CTR become a logic level "low". If the signal is inputted to the first and second ANAD gates ND1, ND2 of the synchronous divider 28a-1, the NAND gates output a logic level "high". As a result, the synchronous divider 28a-1 becomes a four-divider having two flip-flops and an inverter. Therefore, as shown in FIG. 4, the synchronous divider 28a-1 operates in a four dividing mode (/4mode), which maintains one cycle for every four clock cycles (4CLK).

A 4-divided output of the synchronous divider 28a-1 is supplied to the asynchronous divider 28a-2, which operation division at a 32 dividing ratio, as a synchronous signal. Therefore, the asynchronous divider 28a-2, obtains a 128-divided signal.

Next, in a dividing operation at $P+1(=2^7+1=129)$, if outputs of all flip-flops FF4–FF8 of the asynchronous divider 28a-2, in state that a logic level of the mode control signal MC is "high", the control signal CTR maintains a logic level "high" during 4 cycles of the clock CLK. If the signal is inputted to the first and second NAND gates ND1, ND2 of the synchronous divider 28a-1, the NAND gates operate like the inverter, resulting in 5-divider having three flip-flops, an inverter and a NAND gate. Therefore, the P+1 divider operates in a 5-dividing mode only for 4 clock cycles, as shown in FIG. 4.

When comparing a result of the 5-dividing mode with the 4-dividing mode, the 5-dividing mode becomes identical to the 4-dividing mode when delaying a logic level "high" signal of the 4-dividing mode as much as one cycle. When taking over the signal to the next asynchronous divider 28a-2, 1 clock cycle (1CLK) is delayed to obtain 129-divided signal.

However, such conventional dual-modulus prescaler employs many flip-flops, or 1 to 3 flip-flops, operated by an output frequency of a high speed VCO, which requires a large amount of energy for each flip-flops. In addition, because a drive capability of the VCO is limited due to abundant loads for each flip-flop, the prescaler requires more power. Moreover, a load amount, which the first flip-flop should drive, is more than that of a general asynchronous divider.

In addition, in the conventional dual-modulus prescaler, logic gates of the synchronous divider for making the P+1 dividing are used as delay elements. That is, the suitable P+1 dividing operation can be obtained only when a delay generated in the first flip-flop have an equational relation with a delay generated in the inverter and the first NAND gate during one cycle.

$$t_{dFF1} + t_{dINV} + t_{dND1} < T \qquad \text{Equation 2}$$

where T is a clock cycle, $t_{dFF1}$ is a delay time of the first flip-flop, $t_{dINV}$ is a delay time of the inverter and $t_{dND1}$ is a delay time of the first NAND gate.

Furthermore, in the prior art, the synchronous divider generates delays twice as much as the asynchronous divider.

SUMMARY OF THE INVENTION

The present invention is designed to overcome drawbacks of the prior art. An object of the present invention is to provide a dual-modulus prescaler for a RF synthesizer, which may give more improved characteristics in operation rate and energy consumption aspects by implementing the dual-modulus prescaler, which is one component of the PPL module, with use of a selective latch technique which makes a selective latch latching a feedback signal thereof in an area where a latch control signal is enabled and makes a clock pulse from a voltage controlled oscillator passing as it is.

In order to accomplish the above object, the present invention provides a dual-modulus prescaler for a RF (Radio Frequency) synthesizer which has a voltage controlled oscillator (VCO) for generating a clock signal and a programmable counter for generating a mode control signal to select a frequency-dividing mode, the dual-modulus prescaler comprising a first frequency-dividing circuit for being synchronized to the clock signal to generate a latch control signal, latching the clock signal at a leading edge of the generated latch control signal, changing the frequency-dividing mode from a first frequency-dividing mode to a second frequency-dividing mode when latching the clock signal, and frequency-dividing and outputting the clock signal; a second frequency-dividing circuit for frequency-dividing the frequency divided signal from the first frequency-dividing circuit at a predetermined frequency-dividing ratio and outputting a plurality of frequency divided signals; and a logic operation circuit for logically operating a plurality of the frequency divided signals and the mode control signal to control the dividing mode of the first frequency-dividing circuit.

The first frequency-dividing circuit may include a first flip-flop circuit for being synchronized to the clock signal to generate the latch control signal; a latch for selectively latching the clock signal in a predetermined cycle of the clock signal at the leading edge of the latch control signal; a second flip-flop circuit for frequency-dividing an output signal of the latch at a predetermined frequency-dividing ratio to generate a first frequency divided signal; a third flip-flop for frequency-dividing the first frequency divided signal at a predetermined frequency-dividing ratio to output second and third frequency divided signals; and a first AND gate for AND operating the second and third frequency divided signals and the frequency-dividing mode control signal from the logic operation circuit to output the operated signal to an input terminal of the first flip-flop.

The latch preferably feeds back an output signal as an input thereof.

The second flip-flop may generate the first frequency divided signal, made by two frequency-dividing an output signal of the latch in response to a falling edge of the output signal of the latch.

The second flip-flop preferably feeds back an inverted output signal as an input thereof.

The third flip-flop may output the second frequency divided signal, which is made by dividing by two the first frequency divided signal in response to a falling edge of the first frequency divided signal, and the third frequency divided signal, which is made by delaying the second frequency divided signal as much as a half cycle.

The third flip-flop preferably feeds back an inverted output signal of the first frequency divided signal as an input thereof.

The second frequency-dividing circuit may include a plurality of stages of asynchronous flip-flop circuits, which sequentially divide the second frequency divided signal at a predetermined frequency-dividing ratio and output a plurality of the frequency divided signals.

Preferably, one flip-flop of a plurality of the flip-flops outputs an output signal to a synchronous signal input terminal of a next flip-flop, and feeds back an inverted output signal to an input terminal of the flip-flop itself.

The first frequency-dividing circuit may perform a four frequency-dividing mode operation when the output signal of the first AND gate is in a first logic level, and perform a five frequency-dividing mode operation when the output signal of the first AND gate is enabled to a second logic level.

The logic operation circuit may include a second AND gate for AND operating a plurality of frequency divided signals from the second frequency-dividing circuit and the frequency-dividing mode control signal.

BRIEF DESCRIPTION OF THE DRAWINGS

These and other features, aspects, and advantages of the present invention will become better understood with regard to the following description, appended claims, and accompanying drawings, in which like components are referred to by like reference numerals. In the drawings:

DETAILED DESCRIPTION OF THE PREFERRED EMBODIMENT

Hereinafter, preferred embodiments of the present invention will be described in detail with reference to the accompanying drawings.

Figure 5:
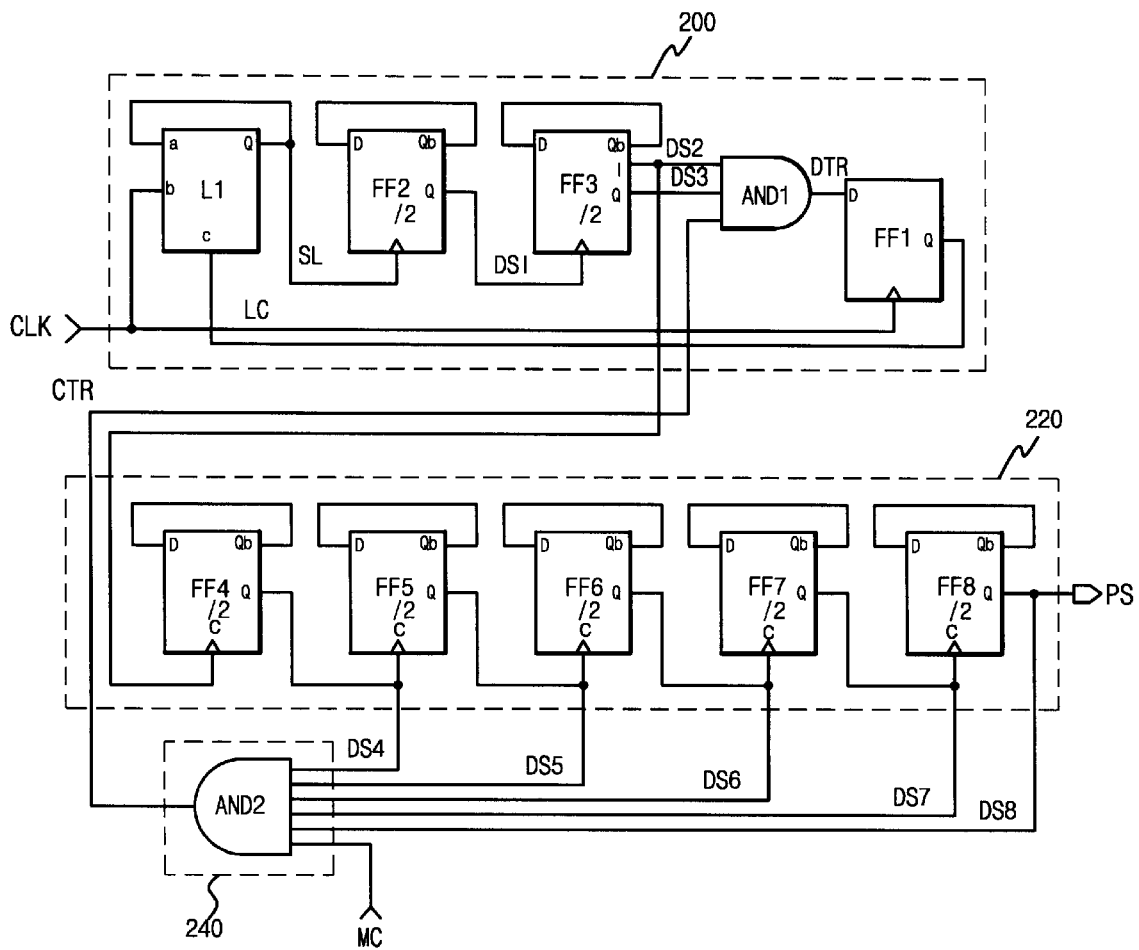
FIG. 5 is a block diagram showing a dual-modulus prescaler according to the present invention.

FIG. 5 is a block diagram for illustrating a dual-modulus prescaler according to an embodiment of the present invention. A reference "CLK" indicates a clock signal that a voltage controlled oscillator VCO supplies, and "MC" indicates a mode control signal that a programmable counter provides for selecting a dividing mode.

The dual-modulus prescaler includes a first dividing unit 200 for generating a latch control signal LC with being synchronized with the clock signal CLK, selectively latching the clock signal CLK at a leading edge of the generated latch control signal LC for a predetermined cycle area, converting to a second dividing mode from a first dividing mode when latching the clock signal CLK, dividing the clock signal and then outputting the divided signal, a second dividing unit 220 for dividing the divided signal from the first dividing unit 200 at a predetermined ratio and then outputting a plurality of divided signals DS4–DS8, and an arithmetic and logic unit 240 for logically operating a plurality of the divided signals DS4–DS8 and the mode control signal MC, generating a control signal CTR to control the dividing mode of the first dividing unit 200 and then supplying the control signal CTR to the first dividing unit 200.

The first dividing unit 200 includes a first flip-flop FF1 for generating the latch control signal LC with being synchronized with the clock signal CLK, a latch L1 for selectively latching the clock signal CLK at a leading edge of the latch control signal LC for a predetermined cycle area, a second flip-flop FF2 for dividing the output signal of the latch L1 and then outputting a first divided signal DS1, a third flip-flop FF3 for dividing the output signal of the second flip-flop FF2 at a predetermined ratio and then outputting second and third divided signals DS2, DS3 through output terminals I, Q, and a first AND gate AND1 for AND operating the second and third divided signals DS2, DS3 and the control signal CTR from the arithmetic and logic unit 240 and then outputting the operated signal to an input terminal D of the first flip-flop FF1.

The latch L1 outputs a latch signal SL through the output terminal Q to feed back the latch signal SL to a first input terminal (a) thereof and receives the clock signal CLK at a second input terminal (b).

The second flip-flop FF2 generates the first divided signal DS1 by 2-dividing the latch signal SL of the latch L1 in response to a falling edge of the latch signal SL of the latch L1 and feeds back an inverse output signal of the first divided signal DS1 to an input terminal D thereof through an inverse output terminal Qb.

The third flip-flop FF3 outputs the second divided signal DS2 which is made by 2-dividing the first divided signal DS1, and the third divided signal, made by delaying the first divided signal DS1 as much as a half cycle. The third flip-flop FF3 also outputs an inverse output signal of the first divided signal DS1 through an inverse output terminal Qb to feed back the inverse output signal as an input thereof.

The second dividing unit 220 includes a plurality of flip-flops FF4–FF8, which sequentially divides the second divided signal DS2 and outputs a plurality of the divided signals DS4–DS8. A plurality of the flip-flops FF4–FF8, respectively, output an output signal to an input terminal C of the next flip-flop in an asynchronous method and output an inverse output signal through an inverse output terminal Qb to feed back the inverse output signal to an input terminal D thereof.

The arithmetic and logic unit 240 includes a second AND gate AND2 for AND operating a plurality of the divided signals DS3–DS7 from the second dividing unit 220 and the mode control signal MC.

Figure 6:
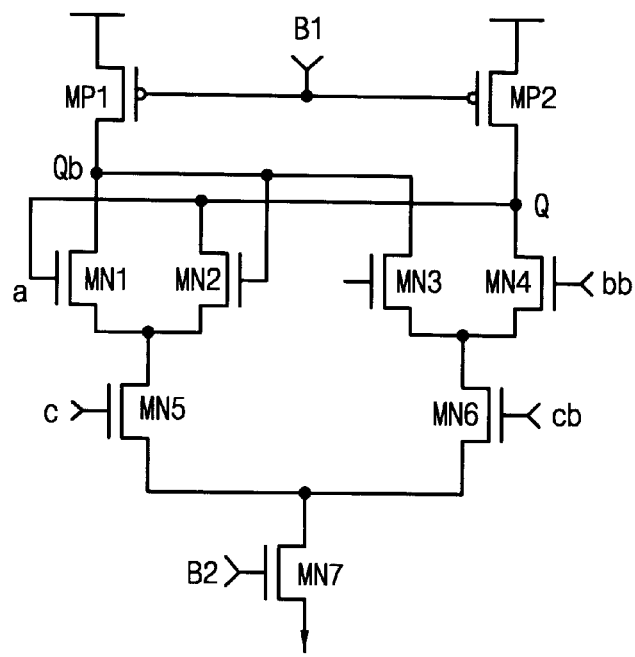
FIG. 6 shows a detailed circuit of a selective latch according to the present invention.

FIG. 6 shows a detailed circuit of the selective latch L1 according to an embodiment of the present invention. In the figure, a reference symbol "B1" indicates a first bias voltage input terminal, "B2" indicates a second bias voltage input terminal, "MP1" and "MP2" indicate PMOS (P-channel Metal Oxide Semiconductor) transistors, "MN1" and "MN7" indicate NMOS (N-channel Metal Oxide Semiconductor) transistors, "a" indicates a first input terminal, "ab" indicates an inverse first input terminal, "b" indicates a second input terminal, "bb" indicates an inverse second input terminal, "c" indicates a third input terminal, "cb" indicates an inverse third input terminal, "Q" indicates an output terminal, and "Qb" indicates an inverse output terminal.

The selective latch L1 has a differential IO (input-output) terminal in a current mode logic (CML) shape, and forms a feedback circuit by that the output terminal Q is combined to a gate terminal of the NMOS transistor MN1, the inverse output terminal Qb is combined to a gate terminal of the NMOS transistor MN2, the output terminal Q is combined to a gate terminal of the NMOS transistor MN2, and the inverse output terminal Qb is combined to a gate terminal of the NMOS transistor MN1.

Figure 7:
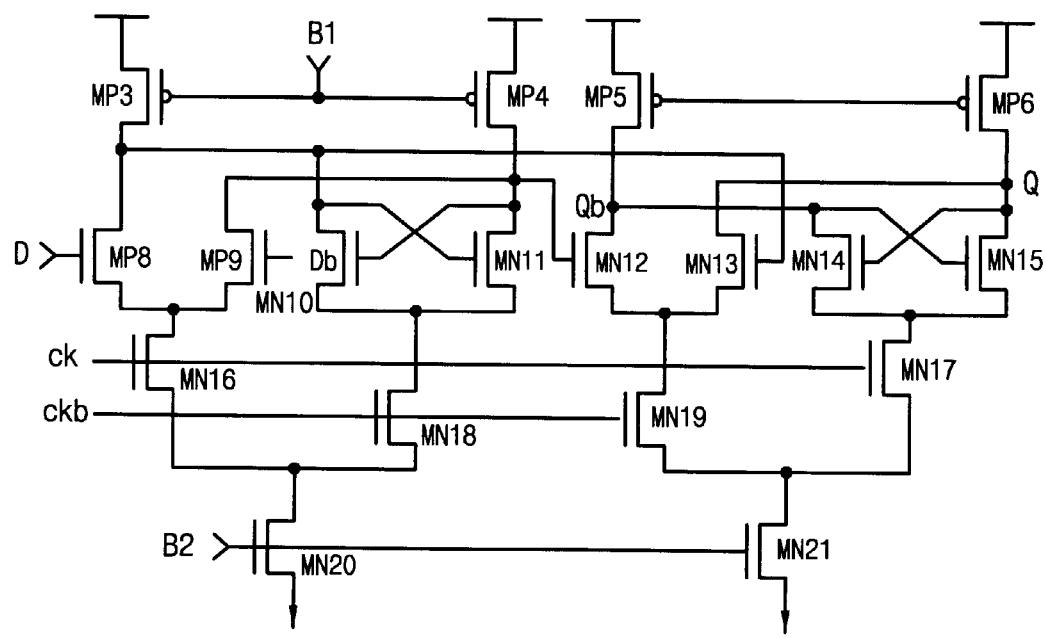
FIG. 7 shows a detailed circuit of a two divider flip-flop and a first flip-flop according to the present invention.

FIG. 7 shows a detailed circuit of the first flip-flop FF1 which is a sampling flip-flop, and 2-divider flip-flops FF2, FF3, FF4, FF5, FF6, FF7, FF8 according to an embodiment of the present invention. A reference symbol "B1" indicates a first bias voltage input terminal, "B2" indicates a second bias voltage input terminal, "MP3" to "MP6" indicate PMOS transistors, "MN8" to "MN21" indicate NMOS transistors, "D" indicates an input terminal, "Db" indicates an inverse input terminal, "Q" indicates an output terminal, "Qb" indicates an inverse output terminal, "ck" indicates a clock signal input terminal, and "ckb" indicates an inverse clock signal input terminal, respectively.

The 2-divider flip-flop includes a master latch and a slave latch, each of which is designed in a current mode logic CML shape and has input and output terminals in a differential type. The output terminal Q and the inverse output terminal Qb of the flip-flop are respectively connected to the inverse input terminal Db and the input terminal D.

The 2-divider flip-flops FF2, FF3, FF4, FF5, FF6, FF7, FF8 operates in a transparent mode when the clock signal CLK is a logic level "high" and operates in a latch mode when the clock signal CLK is a logic level "low".

The latch L1 employs same flip-flop as one used in the 2-divider, which has two functions described below.

At first, the flip-flop synchronizes an output signal of the first AND gate AND1, asynchronously generated, with the clock signal.

Next, the flip-flop delays the clock signal as much as one cycle by sampling the output of the first AND gate AND1, caused when the output of the third flip-flop FF3 is a logic level "high".

If the first flip-flop FF1 does not exist, the output of the latch L1 maintains its value at the instant of latching the clock signal CLK by the output signal of the first AND gate AND1.

Figure 8:
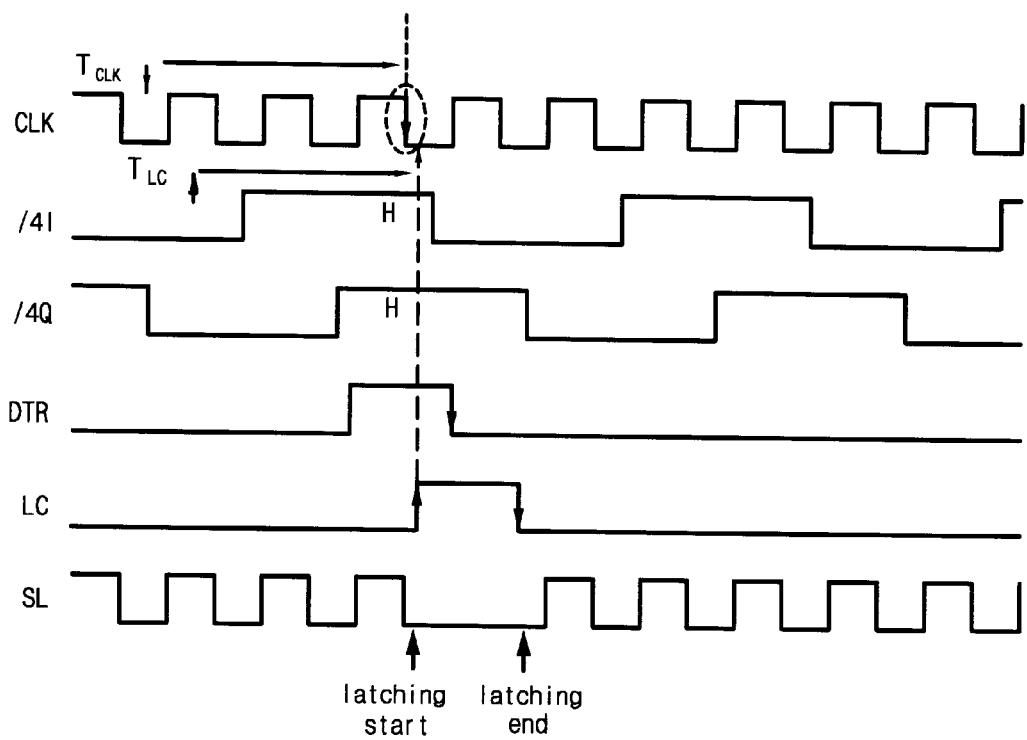
FIG. 8 shows a timing diagram for illustrating a delay operation of an output signal of the first flip-flop according to the present invention.

FIG. 8 is a timing diagram for illustrating the delaying operation of the latch control signal LC of the first flip-flop FF1 according to an embodiment of the present invention. In the figure, a reference symbol "$T_{CLK}$" indicates a falling time of the clock signal CLK, which makes a falling edge of the latch control signal LC and "$T_{LC}$" indicates a leading time of the latch control signal LC.

As shown in the figure, the falling edge of the latch control signal LC for releasing the latch operation is a falling edge next to the falling edge of the clock signal CLK, which initiates the latch operation. Therefore, if latching the clock signal CLK itself before the falling edge of the clock signal is made, the latch operation cannot be released.

Therefore, in order to make a falling edge of the clock signal CLK for completing the latching operation as described above, the output signal of the first AND gate AND1 should be delayed as much as one cycle. That is, it should ensure an equation 3 below.

$$T_{CLK} < T_{LC} \qquad \text{Equation 3}$$

Figure 9:
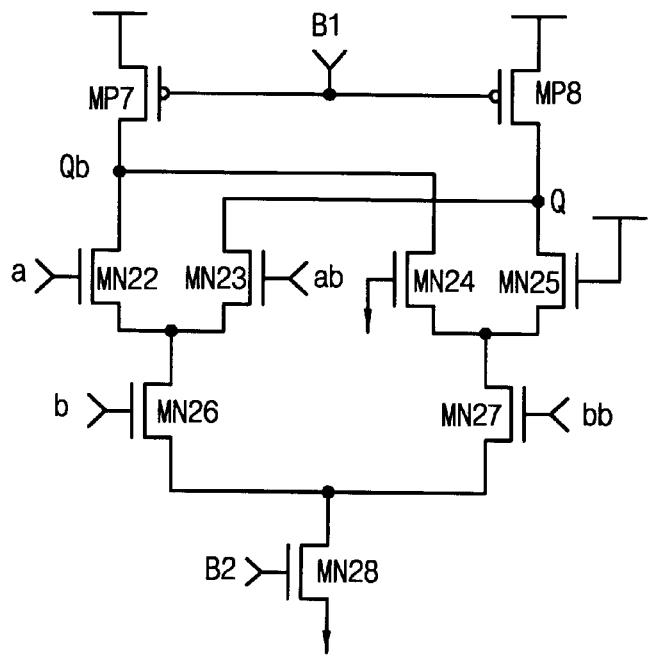
FIG. 9 shows a detailed circuit of one AND gate having first and second AND gates according to the present invention.

FIG. 9 is a detailed circuit showing one of AND gates composing the first AND gate AND1 and the second AND gate AND2 according to an embodiment of the present invention. A reference symbol "B1" indicates a first bias input terminal, "B2" indicates a second bias input terminal, "MP7" and "MP8" indicate PMOS transistors, "MN22" and "MN27" indicate NMOS transistors, "a" and "b" indicate first and second input terminals, "ab" and "bb" indicate an inverse first input terminal and an inverse second input terminal, "Q" indicates an output terminal, and "Qb" indicates an inverse output terminal, respectively.

FIG. 9 shows one AND gate. But, in the embodiment of the present invention, two AND gates are combined to construct the first AND gate AND1 and five AND gates are combined to construct the second AND gate AND2.

Operations of the present invention as construct above are now described below with reference to timing diagrams in FIG. 9 to FIG. 12.

Figure 10:
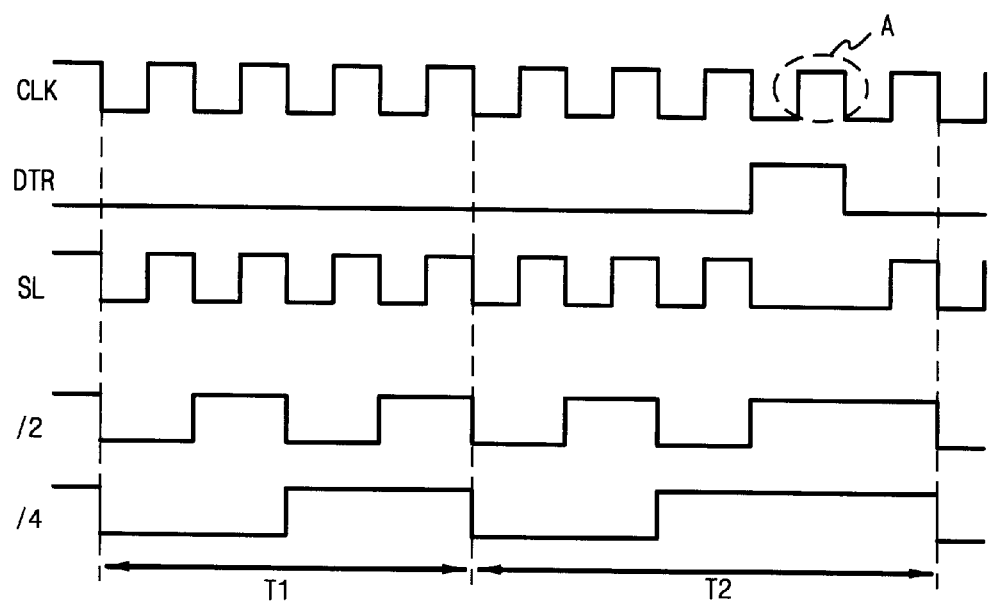
FIG. 10 shows a timing diagram for illustrating a dividing mode operation of the dual-modulus prescaler according to the present invention.

FIG. 10 is a timing diagram for illustrating a dividing mode operation of the dual-modulus prescaler according to an embodiment of the present invention.

Referring to the figure, if the first AND gate AND1 generates an output signal DTR in a logic level "low" when the clock signal CLK is supplied to the latch L1 of the first dividing unit 200, the latch L1 passes the input clock signal CLK as it is in response to the latch control signal LC from the first flip-flop FF1 and then supplies the clock signal CLK to the input terminal of the second flip-flop FF2 which is a 2-divider in the next step.

On the contrary, if the output signal DTR of the first AND gate AND1 changes from a logic level "low" to "high" with the clock signal being supplied, the latch L1 latches a proceeding clock signal in an area that the output signal DTR of the first AND gate AND1 maintains a logic level "high". Then, the latch L1 generates an output signal SL in a logic level "low" and then gives the output signal SL to a synchronous input terminal of the second flip-flop FF2 in the next step.

Therefore, the present invention swallows a positive pulse A of the clock signal, dot-lined in FIG. 9, in an area that the output signal DTR of the AND gate AND1 maintains a logic level "high", and then supplies the positive pulse A to the synchronous input terminal of the second flip-flop FF2. At this time, the term "swallow" means eliminating the clock pulse.

On the other hand, the second flip-flop FF2 2-divides the signal from the latch L1 and supplies the divided signal to a synchronous input terminal of the third flip-flop FF3.

Because the second and third flip-flops FF2, FF3 performs 2-dividing, when the output signal DTR of the AND gate AND1 maintains a logic level "low", the third flip-flop FF3 of the first dividing unit 200 operates in a first dividing mode for generating 4-divided signals (P=4) at a timing area T1. On the other hand, when the output signal DTR of the AND gate AND1 is enabled to a logic level "high", the first dividing unit 200 operates in a second dividing mode for generating 5-divided signals, which is a signal divided as much as P+1 at a timing area T2.

The third flip-flop FF3 of the present invention generates a second divided signal DS2 which is 4-divided, and a third divided signal DS3 which delays the second divided signal DS2 as much as a half cycle, and then supplies the second and third divided signals DS2, DS3 to the AND gate AND1. The third flip-flop FF3 also supplies the second divided signal DS2 to a synchronous input terminal of the fourth flip-flop FF4 of the second dividing unit 220 as a synchronous signal.

A plurality of the flip-flops FF4–FF8 composing the second dividing unit 220 of the present invention are respectively 2-dividers and perform the dividing operation in a asynchronous method.

Figure 1:
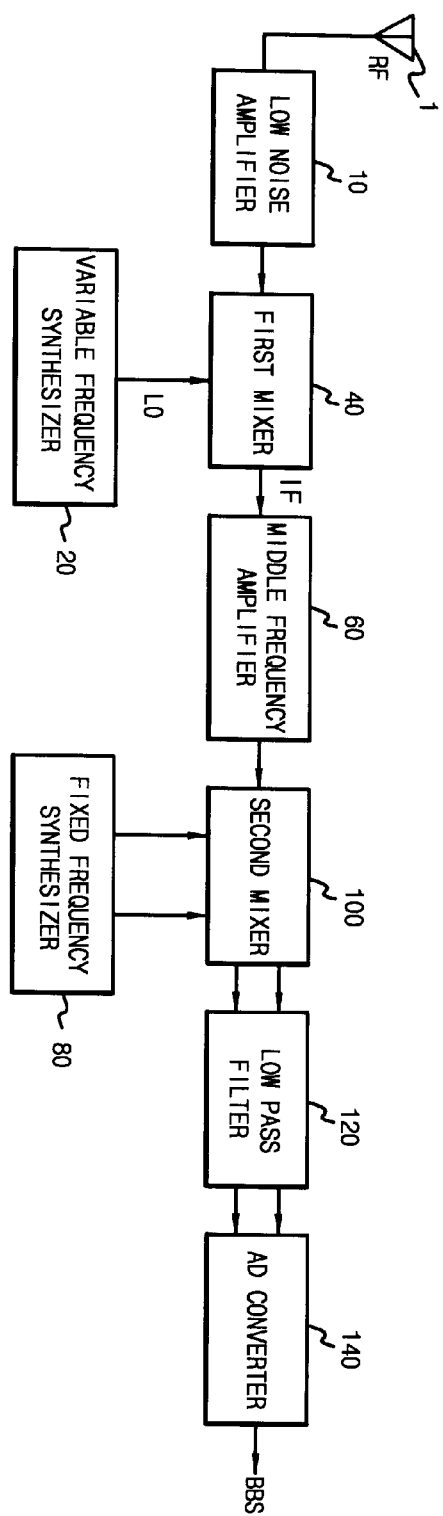
FIG. 1 is a block diagram showing a receiver in a common portable personal mobile communication terminal.
Figure 2:
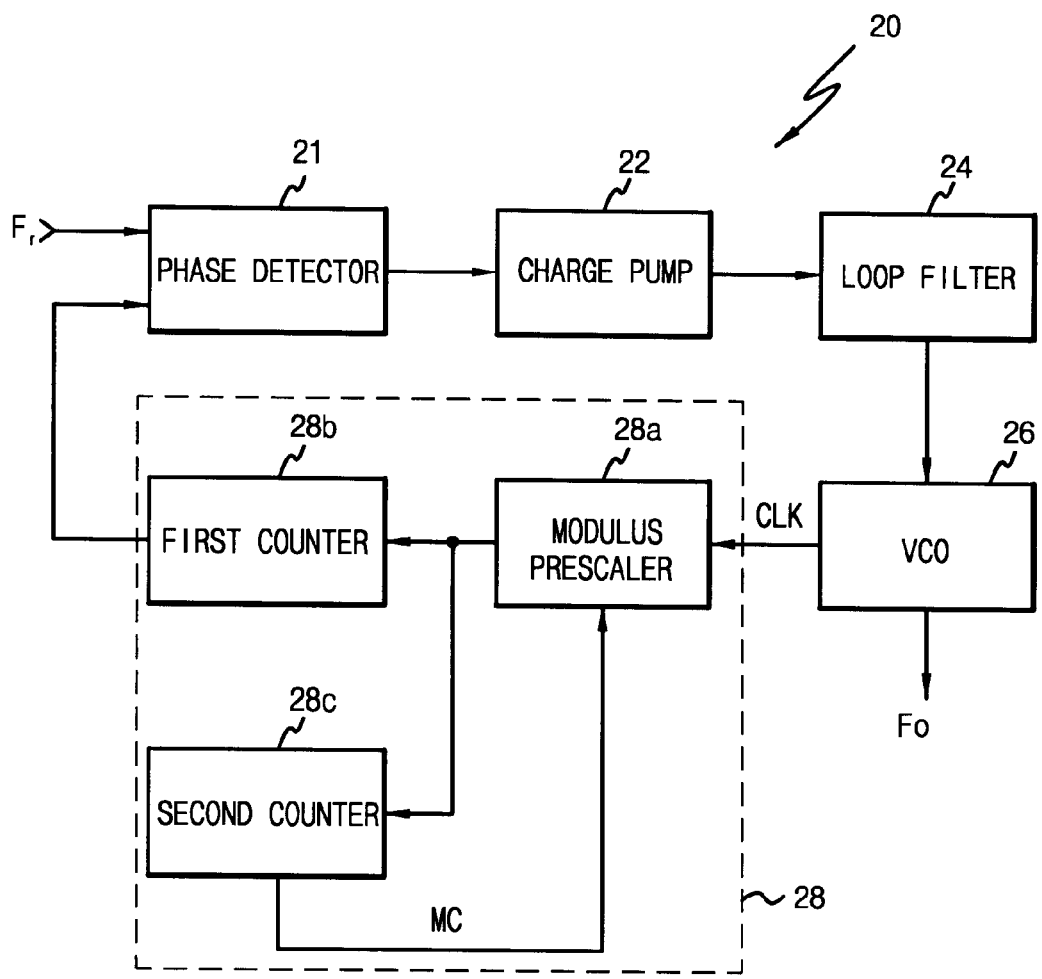
FIG. 2 is a block diagram showing a general frequency synthesizer.
Figure 3:
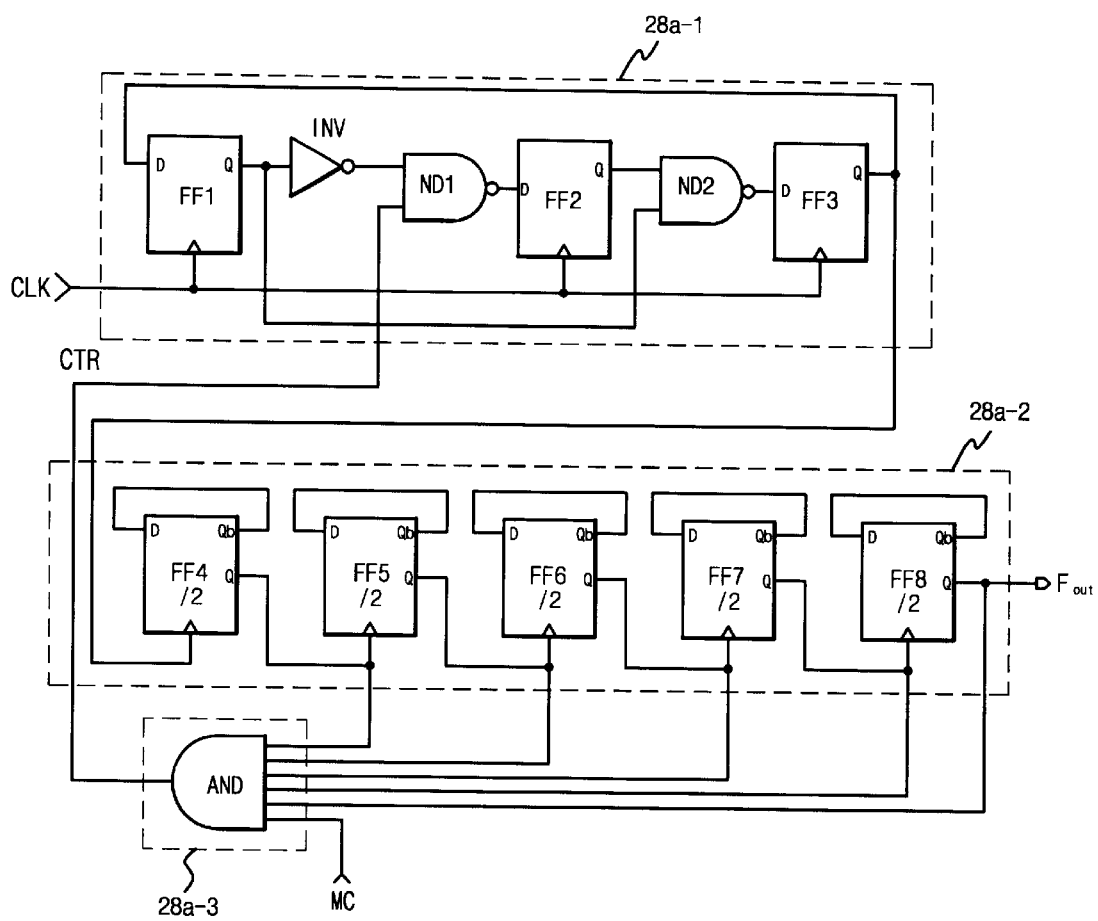
FIG. 3 is a block diagram showing a conventional dual-modulus prescaler using a shift register ring method.
Figure 4:
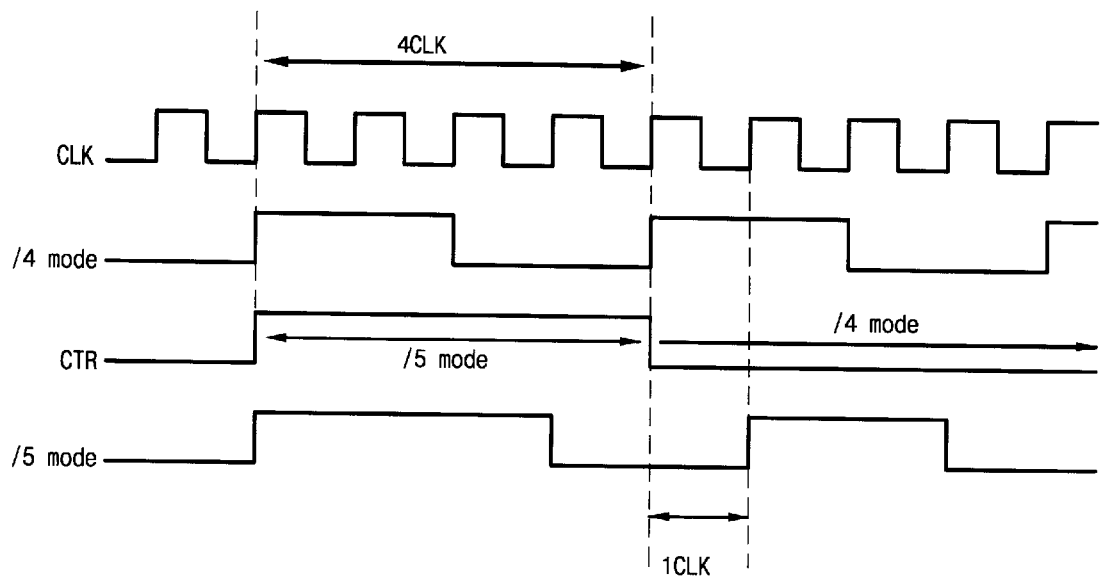
FIG. 4 shows a timing diagram for illustrating operation of the conventional dual-modulus prescaler.

In the second dividing unit 220, the fourth flip-flop FF4 2-divides the second divided signal DS2 and output the third divided signal DS3. The fourth flip-flop FF4 supplies the third divided signal DS3 to a synchronous input terminal of the fifth flip-flop FF5. The fifth to eighth flip-flops FF5–FF8 output divided signals DS4–DS8 with same operation as the fourth flip-flop FF4 in which the divided signal DS8 of the eighth flip-flop FF8 is supplied to the first and second counters 28b, 28c in FIG. 1.

On the other hand, the second AND gate AND2 of the arithmetic and logic unit 240 receives the mode control signal MC from the second counter 28c and receives the divided signals DS4–DS8 from the second dividing unit 220. The second AND gate AND2 then AND operates the mode control signal MC and the divided signals DS4–DS8 to generate a control signal CTR.

Figure 11:
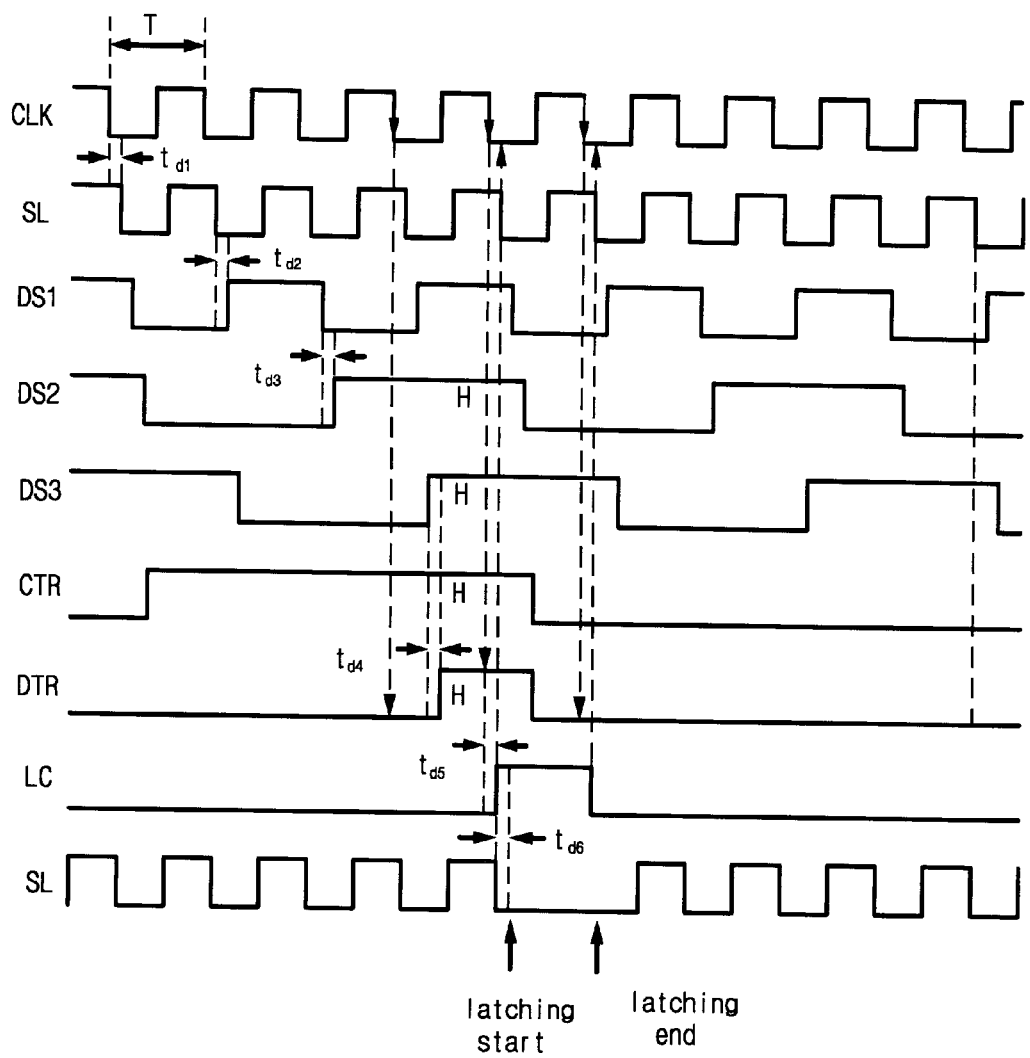
FIG. 11 shows a timing diagram for illustrating a swallowing operation of a clock pulse according to the present invention.

FIG. 11 is a timing diagram for illustrating a pulse swallowing process according to an embodiment of the present invention. As shown in the figure, if the second and third divided signals DS2, DS3 are in a logic level "high" in an area that the control signal CTR is in a logic level "high", the first AND gate AND1 outputs the signal DTR in a logic level "high" for one clock cycle. The output signal DTR is supplied to an input terminal D of the first flip-flop FF1 which is synchronized with the clock signal CLK. The output signal DTR is also applied to a synchronous input terminal© of the latch L1 as a latch control signal LC after delaying for a predetermined time in the first flip-flop FF1

Then, the latch L1 latches the clock signal CLK supplied synchronous with a leading edge of the latch control signal LC. At this time, because the latch control signal LC maintains a logic level "high" only for one cycle of the clock signal CLK, as a result, a pulse of the clock signal CLk is eventually eliminated to obtain the P+1 dividing.

On the other hand, as shown in FIG. 11, a propagation delay is generated as much as $t_{d1}+t_{d2}+t_{d3}+t_{d4}$ until the AND gate generates an output signal because an output signal SL of the latch L1 is delayed as much as $t_{d1}$, the divided signal DS1 divided by the second flip-flop FF2 is delayed as much as $t_{d2}$ to a falling edge of the output signal SL of the second flip-flop FF2 the divided signal DS2 of the second flip-flop FF3 is delayed as much as $td_3$ to a falling edge of the divided signal DS1 of the second flip-flop FF2 the output signal DTR of the AND gate AND1 is delayed as much as $td_4$ to a leading edge of the divided signal DS3 of the third flip-flop, the latch control signal LC is delayed as much as $t_{d5}$ to a falling edge of the clock signal supplied in an area that the output signal DTR of the AND gate AND1 maintains a logic level "high". However, the output signal is synchronized again in the latch L1 by the clock signal CLK in the present invention, only the $t_{d5}$ gives an important effect on the propagation delay. If the latch L1 having a pulse swallow logic may eliminate only the positive pulse of the clock signal, the Equation 4 below should be satisfied for ensuring suitable operations of the dual-modulus prescaler.

$$t_{d5} < \frac{T}{2} \qquad \text{Equation 4}$$

where $t_{d5}$ is a delay time of the latch control signal LC and T is a cycle of the clock signal CLK.

However, the conditions exhibited in the Equation 3 are not easily ensured due to such as change of the process. In the present invention, though such conditions are not satisfied, the operation of the dual-modulus prescaler is not influenced. That is, the present invention may always eliminate one pulse of the clock pulse CLK because the latch L1 latches the feedback signal whether the feedback signal is in a logic level "high" or "low" when the output signal of the first flip-flop FF1 is just enabled through the propagation $t_{d5}$ of the first flip-flop FF1 is larger than T/2. If using the selective latching technique, all of positive and negative pulses of the clock signal CLK may be swallowed.

Therefore, because the propagation acts as latency only and ensures a certain latency for whole processes, the present invention may obtain a periodical P+1 dividing operation.

On the other hand, the latching operation of the latch L1, as shown in FIG. 11, starts at a point delayed as much as $t_{d6}$ at a leading edge of the latch control signal and ends after delaying for a predetermined time at a falling edge of the latch control signal.

Figure 12:
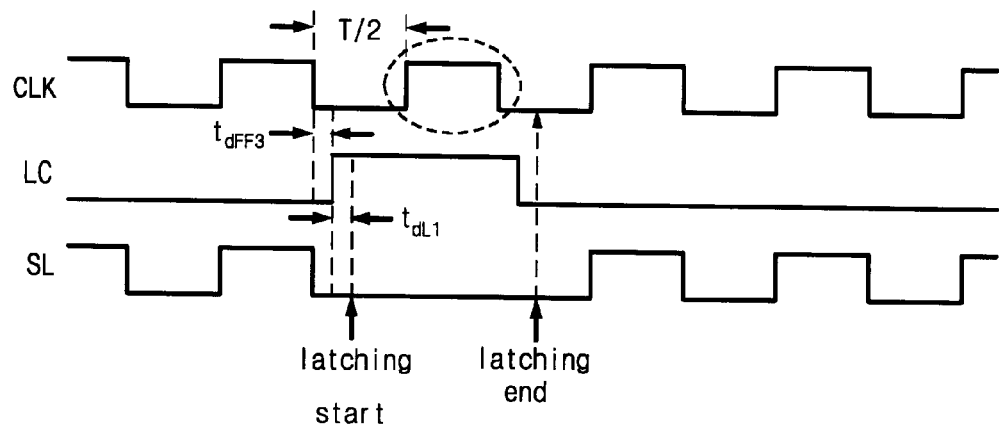
FIG. 12 shows a timing diagram for illustrating a swallowing operation of a positive clock pulse according to the present invention.
Figure 13:
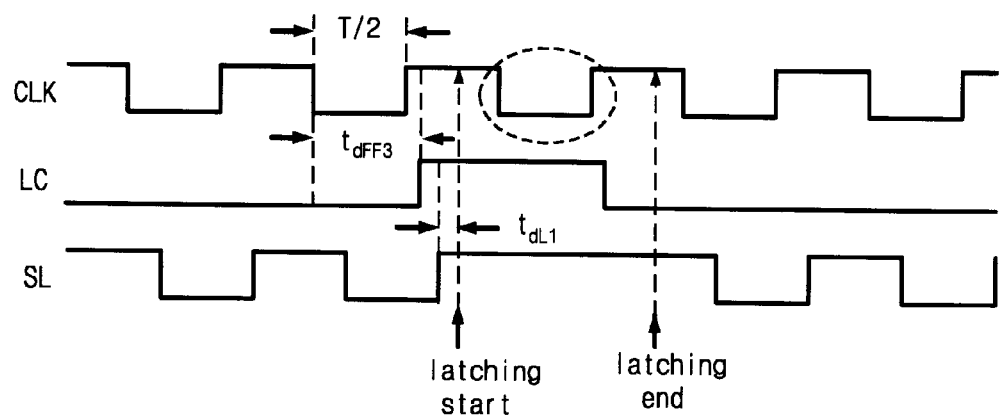
FIG. 13 shows a timing diagram for illustrating a swallowing operation of a negative clock pulse according to the present invention.

FIG. 12 is a timing diagram showing the swallowing process of the positive clock pulse and FIG. 13 is a timing diagram showing the swallowing process of the negative clock pulse according to an embodiment of the present invention. This figures may be easily understood in the above clock pulse swallowing process and not described in detail.

Figure 14:
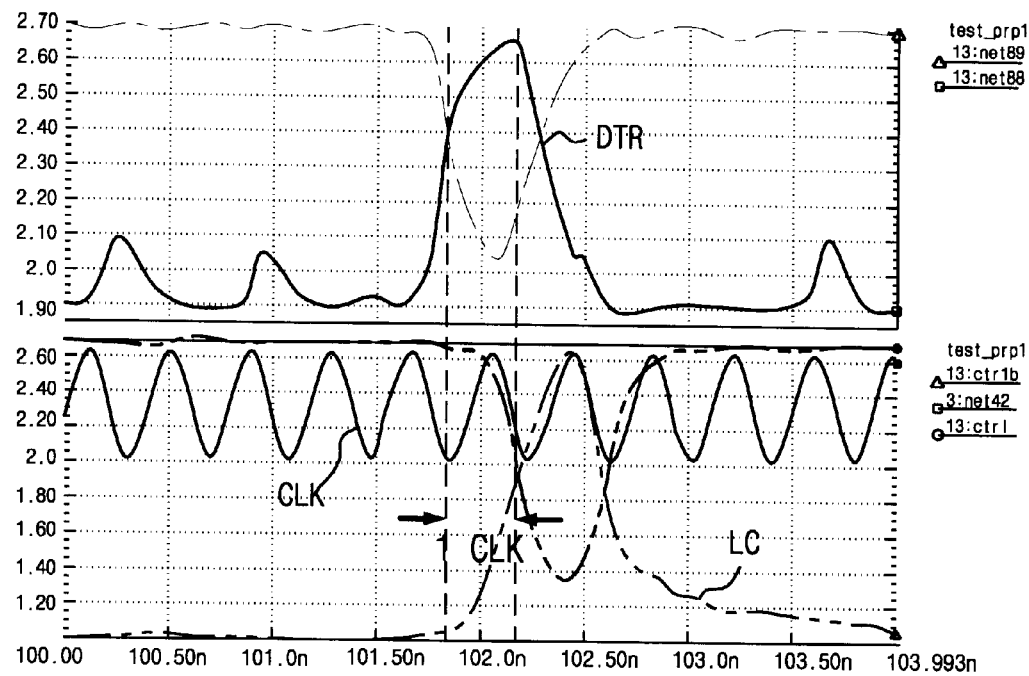
FIG. 14 is a wave diagram showing a latch control signal according to the present invention.

FIG. 14 shows wave shapes of the output signal DTR of the AND gate AND1 and the latch control signal LC of the first flip-flop FF1. As shown in the figure, the latch control signal LC is delayed as much as one cycle to the output signal DTR of the AND gate AND1.

Figure 15:
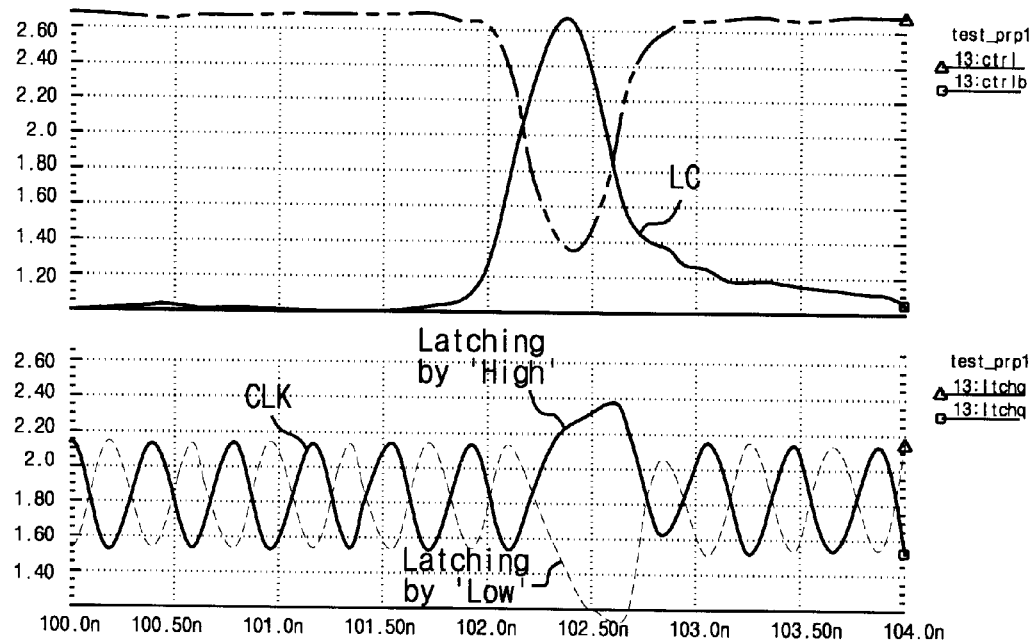
FIG. 15 is a wave diagram showing an output of the selective latch according to the present invention.

FIG. 15 shows a wave shape of the output signal SL of the latch L1 according to an embodiment of the present invention. In the figure, it can be seen that the clock signal CLK is latched from a logic level "high" to "low".

Figure 16:
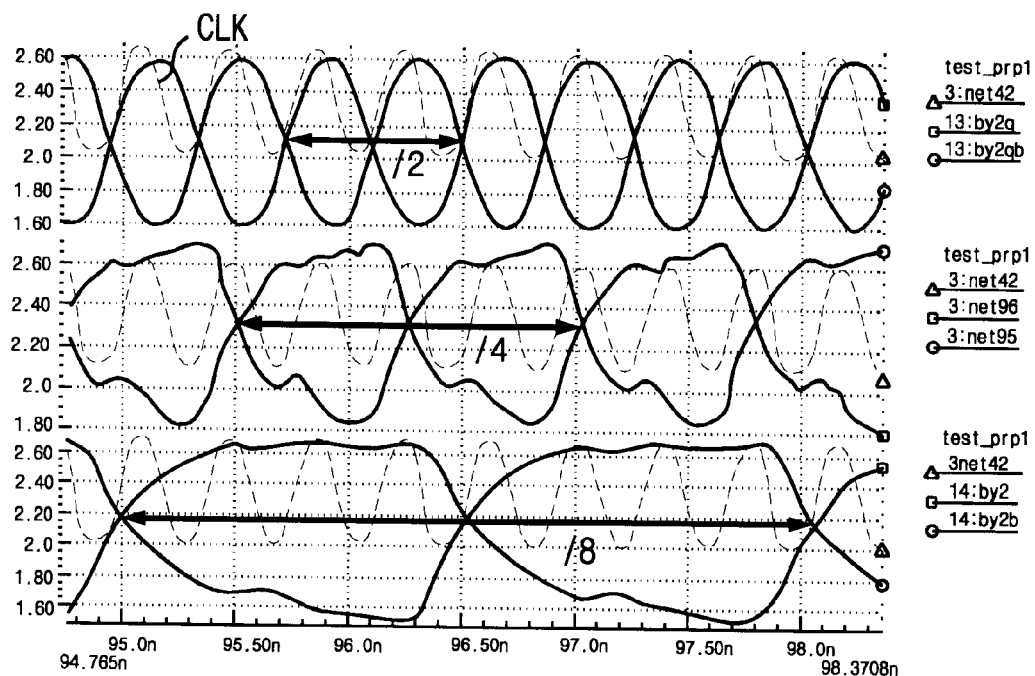
FIG. 16 is a wave diagram showing a divided signal in a first dividing mode operation according to the present invention.

FIG. 16 shows a wave shape of the divided signal in the first dividing mode operation according to an embodiment of the present invention. The figure shows the divided signals, which are two frequency-divided, four frequency-divided and eight frequency-divided.

Figure 17:
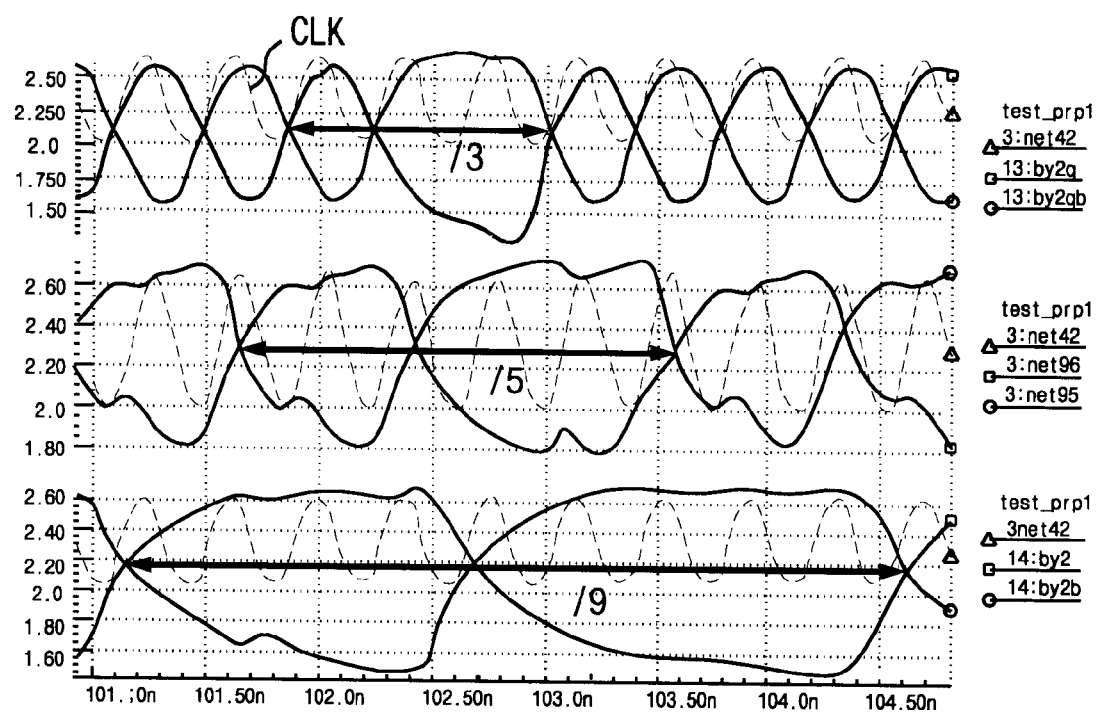
FIG. 17 is a wave diagram showing a divided signal in a second dividing mode operation according to the present invention.

FIG. 17 shows a wave shape of the divided signal in the second dividing mode operation according to an embodiment of the present invention. The figure shows the divided signals, which are three frequency-divided, five frequency-divided and nine frequency-divided.

Figure 18:
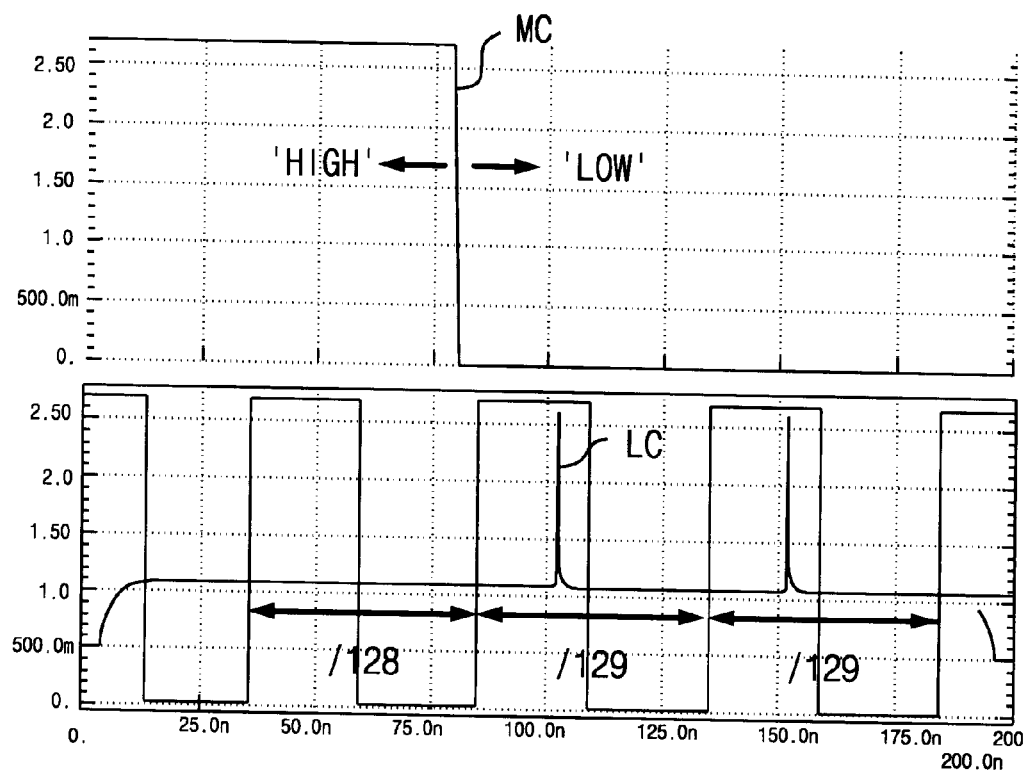
FIG. 18 is a wave diagram showing an output wave of the dual-modulus prescaler according to the present invention.

FIG. 18 shows a wave shape of a final output signal of the dual-modulus prescaler according to an embodiment of the present invention. In the figure, it can be easily understood that a dividing ration depends on the mode control signal MC, which determines the dividing ratio of the dual-modulus prescaler. That is, in an area that the mode control signal MC is in a logic level "high", the prescaler operates the P dividing, or 128 frequency-dividing, which makes it unnecessary to latch the clock signal CLK and so the output signal of the first flip-flop FF1 does not appear. On the other hand, if the mode control signal MC becomes in a logic level "low", it would be understood that the prescaler operates the P+1 dividing, or 129 frequency-dividing, which makes the output signal of the first flip-flop FF1 be enabled once per 129 frequency-dividing.

Figure 19:
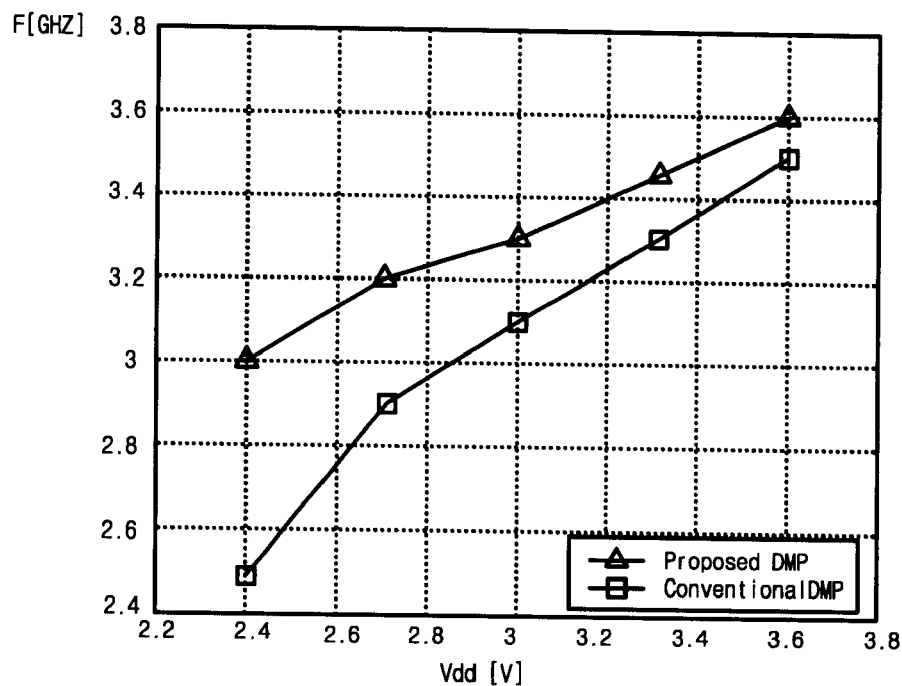
FIG. 19 is a diagram for showing comparison of operation rates of dual-modulus prescaler according to the present invention.

FIG. 19 shows a simulated result which compares operating ratios of the conventional dual-modulus prescaler using the shift ring method and the dual-modulus prescaler in an asynchronous type of the present invention. The figure shows change of an action frequency F for a line voltage Vdd.

As shown in the figure, when the line voltage Vdd is 2.7V, a maximum action frequency is 2.9 GHz in the prior art and 3.2 GHz in the present invention.

When comparing energy consumption, the prior art consumes 28.3 mW and the present invention consumes 22.6 mW at an action frequency of 2.6 GHz.

Therefore, it is understood that the present invention has improved in aspects of action rate and energy consumption.

In the future, it is inevitable that the frequency band becomes higher and therefore consumption energy becomes increased to used the frequency, which is a limited resource. In such a circumstance, if being applied to the PLL module in a RF band, the present invention may improve the action rate up to 17% and reduce the energy consumption down to 20%.

Though specific embodiments such as a 4/5 divider and 32-divider are described and shows, it is apparent to the person skilled in the art that any change or modification will be possible.

It should be understood that the detailed description and specific examples, while indicating preferred embodiments of the invention, are given by way of illustration only, since various changes and modifications within the spirit and scope of the invention will become apparent to those skilled in the art from this detailed description.

As described above, the present invention may give more improved characteristics in operation rate and energy consumption aspects by implementing the dual-modulus prescaler, which is one component of the PPL module with use of a selective latch technique which makes a selective latch latching a feedback signal thereof in an area where a latch control signal is enabled and makes a clock pulse from a voltage controlled oscillator passing as it is, and may give another effect that solves the delay problems in an asynchronous configuration by enabling to eliminate both positive and negative pulses of the clock signal.

What is claimed is:

1. A dual-modulus prescaler comprising:
    a voltage controlled oscillator (VOC) for generating a clock signal;
    a programmable counter for generating mode control signal;
    a first frequency-dividing circuit connected to the VOC and including a first flip-flop circuit for generating a latch control signal upon latching of the clock signal, a latch for selectively latching the clock signal during an enabled time of the latch control signal, a second flip-flop circuit for generating a first frequency divided signal by frequency-dividing an output clock signal of the latch, a third flip-flop circuit for generating a second frequency divided signal and a third frequency divided signal by frequency-dividing the first frequency divided signal, and an AND gate circuit connected to the third flip-flop circuit and the first flip-flop circuit;
    a second frequency-dividing circuit connected to the first frequency-dividing circuit and having (n−1) stages of flip-flop circuits for generating a plurality of frequency divided signals by frequency-dividing the second frequency divided signal, wherein n is a natural number equal to or greater than 2;
    a logic operation circuit connected to the first frequency-dividing circuit and the second frequency-dividing circuit, for generating a frequency-dividing mode control signal and supplying the frequency-dividing mode control signal to the first frequency-dividing circuit;
    wherein the logic operation circuit generates the frequency-dividing mode control signal by performing a logic multiplication operation on a plurality of the frequency divided signals of the second frequency-dividing circuit and the mode control signal of the programmable counter, and outputs the frequency-dividing mode control signal to the AND gate circuit of the first frequency-dividing circuit, and
    wherein the AND gate circuit generates a control signal by performing a logic multiplication operation on the second frequency divided signal, the third frequency divided signal and the frequency-dividing mode control signal, and outputs the control signal to the first flip-flop circuit, and
    wherein the first flip-flop circuit thereby controls the frequency-dividing mode according to the control signal.

2. The dual-modulus prescaler as claimed in claim 1, wherein the latch feeds back an output signal as an input thereof.

3. The dual-modulus prescaler as claimed in claim 1, wherein the second flip-flop circuit generates the first frequency divided signal, which is made by two frequency-dividing an output signal of the latch in response to a falling edge of the output signal of the latch.

4. The dual-modulus prescaler as claimed in claim 1, wherein the second flip-flop circuit feeds hack an inverted output signal as an input thereof.

5. The dual-modulus prescaler as claimed in claim 1, wherein the third flip-flop circuit outputs both the second frequency divided signal, which is made by two frequency-dividing the first frequency divided signal in response to a falling edge of the first frequency divided signal, and the third frequency divided signal, which is made by delaying the second frequency divided signal as much as a half cycle.

6. The dual-modulus prescaler as claimed in claim 1, wherein the third flip-flop circuit feeds back an inverted output signal of the second frequency divided signal as an input thereof.

7. The dual-modulus prescaler as claimed in claim 1, wherein (n−1) stages of the flip-flop circuits of the second frequency-dividing circuit sequentially divide the second frequency divided signal at a predetermined frequency-dividing ratio and output a plurality of the frequency divided signals.

8. The dual-modulus prescaler as claimed in claim 1, wherein the first frequency-dividing circuit performs a four frequency-dividing mode operation when the output signal of the AND gate circuit is in a first logic level, and performs a five frequency-dividing mode operation when the output signal of the AND gate is enabled to a second logic level.

9. The dual-modulus prescaler as claimed in claim 1, wherein the logic operation circuit includes a logical AND gate circuit for combining a plurality of frequency divided signals from the second frequency-dividing circuit and the mode control signal from the programmable counter.

* * * * *